(12) United States Patent  (10) Patent No.: US 9,136,320 B2
Chang  (45) Date of Patent: Sep. 15, 2015

(54) FIELD EFFECT TRANSISTOR
(71) Applicant: DESIGN EXPRESS LIMITED, Tortola (VG)
(72) Inventor: Chun Yen Chang, Hsinchu County (TW)
(73) Assignee: DESIGN EXPRESS LIMITED (VG)
( * ) Notice: Subject to any disclaimer, the term of this patent is extended or adjusted under 35 U.S.C. 154(b) by 54 days.
(21) Appl. No.: 13/858,439
(22) Filed: Apr. 8, 2013
(65) Prior Publication Data
US 2014/0299923 A1  Oct. 9, 2014
(51) Int. Cl.
*H01L 29/04* (2006.01)
*H01L 29/10* (2006.01)
(Continued)
(52) U.S. Cl.
CPC ........ *H01L 29/045* (2013.01); *H01L 21/26533* (2013.01); *H01L 29/0653* (2013.01);
(Continued)
(58) Field of Classification Search
CPC .................. H01L 21/26533; H01L 29/42356; H01L 29/7391; H01L 29/1033; H01L 29/0653; H01L 29/0657; H01L 29/045; H01L 29/7827; H01L 29/785; H01L 29/66795; H01L 27/1203; H01L 21/823807
USPC ........... 257/E21.413, E27.111, E29.293, 194, 257/E21.431, E29.246, 192, 288, 59, 257/E21.133, E21.407, E21.409, E21.433, 257/E21.507, E29.004, E29.104, E29.188, 257/E29.249, E29.273, 190, 347, 55, 56, 257/57, 58, 60, 61, 62, 627, 628, 63, 64, 65, 257/67, 72, E21.063, E21.066, E21.09, 257/E21.112, E21.113, E21.121, E21.124, 257/E21.125, E21.126, E21.134, E21.158, 257/E21.192, E21.197, E21.22, E21.223, 257/E21.345, E21.346, E21.347, E21.403, 257/E21.43, E21.505, E21.548, E21.549, 257/E21.619, E21.634, E23.016, E29.027, 438/486, 300, 487, 149, 166, 172, 299, 438/303, 479, 488, 138, 150, 197, 270, 271, 438/285, 296, 30, 301, 302, 304, 305, 426, 438/427, 436, 438, 478, 482, 483, 485, 489, 438/5, 511, 528, 589, 590, 639, 694, 745, 438/795, 931, 945, 973, 977; 349/129, 113, 349/114, 155, 156, 43, 122, 38, 107, 112, 349/133, 166, 174, 39, 47, 93, 100, 110, 349/111, 118, 123, 127, 130, 139, 141, 143, 349/158, 172, 173, 4, 46, 84, 94, 96, 66, 349/E21.102, E21.123, E21.131; 345/87, 345/94, 96, 54, 89, 95, 97
See application file for complete search history.

(56) References Cited

U.S. PATENT DOCUMENTS 7,115,920 B2  10/2006  Bernstein et al.
2007/0045736 A1*  3/2007  Yagishita ...................... 257/347
(Continued)

OTHER PUBLICATIONS

Weitao Cheng, et al., "Very High Performance CMOS on Si(551) Using Radical Oxidation Technology and Accumulation-Mode SOI Device Structure", Journal of the Electrochemical Society, 2010, vol. 157(3), pp. H389-H393.

*Primary Examiner* — Colleen A Matthews
*Assistant Examiner* — Junaiden Mirsalahuddin
(74) *Attorney, Agent, or Firm* — WPAT, P.C.; Anthony King; Kay Yang (57) ABSTRACT

A field effect transistor includes a semiconductor substrate having a protrusion with at least one inclined surface, a gate insulator disposed at least on a portion of the inclined surface, and a gate conductor disposed on the gate insulator, wherein the semiconductor substrate comprises doped regions sandwiching a channel region, wherein the at least one inclined surface has a first crystal orientation in the channel region, and the inclined surface has an included angle to a vertical plane with a second crystal orientation. The hole mobility and the electron mobility are substantially the same in the channel region having a crystalline orientation off from the (110) crystal orientation.

14 Claims, 14 Drawing Sheets

(51) Int. Cl.
*H01L 21/265* (2006.01)
*H01L 29/423* (2006.01)
*H01L 29/739* (2006.01)
*H01L 29/78* (2006.01)
*H01L 29/06* (2006.01)

(52) U.S. Cl.
CPC ........ *H01L29/0657* (2013.01); *H01L 29/1033* (2013.01); *H01L 29/42356* (2013.01); *H01L 29/7391* (2013.01); *H01L 29/7827* (2013.01)

(56) References Cited

U.S. PATENT DOCUMENTS

| | | | |
|---|---|---|---|
| 2007/0187682 A1* | 8/2007 | Takeuchi et al. | 257/64 |
| 2008/0121948 A1 | 5/2008 | Kim et al. | |
| 2010/0224935 A1* | 9/2010 | Ono | 257/368 |
| 2011/0147838 A1* | 6/2011 | Gossner et al. | 257/345 |
| 2012/0175710 A1 | 7/2012 | Xiong et al. | |
| 2012/0295426 A1 | 11/2012 | Cohen et al. | |
| 2014/0203329 A1* | 7/2014 | Saitoh et al. | 257/194 |

* cited by examiner

FIELD EFFECT TRANSISTOR

FIELD OF THE INVENTION

The present disclosure relates to a field effect transistor (FET), and more particularly, to a field effect transistor having a carrier channel of a crystalline orientation where the hole mobility and the electron mobility are substantially the same.

DISCUSSION OF THE BACKGROUND

As semiconductor fabrication technology continues to improve, sizes of electronic devices are reduced, and as such, the size and channel length of the planar channel transistor also decrease correspondingly. The planar channel transistor has been widely used in integrated circuits; however, the continuous decreasing of the size and channel length of the planar channel transistor results in a volatile interaction between the two doped regions and a carrier channel under the gate oxide layer such that the controlling ability of the conductive metal layer on the switching operation of the carrier channel is reduced, i.e., causing a so-called "short channel effect", which impedes the functioning of the planar channel transistor.

To solve the above-mentioned problem, non-planar device structures, such as fin-type field effect transistors, are becoming increasingly attractive as device options because of their effective short channel characteristics. The FinFET is a type of transistor that has source and drain regions in contact with a channel region contained in a semiconductor fin. Nearly all FinFETs are fabricated as double-gate FETs with opposing first and second gate conductors on either sidewall of the fin.

A (110) crystal orientation surface is effective for channel hole mobility but poor for channel electron mobility, while the (100) crystal orientation channel surface is poor for channel hole mobility but effective for channel electron mobility. Thus, a (110) sidewall orientation is a preferred orientation for PMOS FinFETs and a (100) sidewall orientation is a preferred orientation for NMOS FinFETs. To provide preferred surface orientations for PMOS and NMOS FinFETs on the same substrate, conventional integrated circuit devices, such as SRAM devices, have NMOS and PMOS FinFETs with different channel crystal orientations laid out in a non-aligned fin layout. Adjacent fins of different conductivity types are generally rotated by 45 degrees to accommodate for the different crystal orientations of the substrate surfaces. Such mixed rotations require increases in layout area of an integrated circuit device and increases lithography difficulties.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a field effect transistor having a carrier channel of a crystalline orientation where the hole mobility and the electron mobility are substantially the same.

A field effect transistor according to this aspect of the present disclosure comprises a semiconductor substrate having a protrusion with at least one inclined surface, a gate insulator disposed at least on a portion of the inclined surface, and a gate conductor disposed on the gate insulator, wherein the semiconductor substrate comprises doped regions sandwiching a channel region, wherein the at least one inclined surface has a first crystal orientation in the channel region, and the inclined surface has an included angle to a vertical plane with a second crystal orientation.

A field effect transistor according to another aspect of the present disclosure comprises a fin structure comprising a semiconductor material, wherein the fin structure comprises doped regions sandwiching a channel region, a gate insulator disposed at least on a portion of the fin structure, and a gate conductor disposed on the gate insulator, wherein the fin structure has at least one inclined surface with a first crystal orientation in the channel region, and the inclined surface has an included angle to a vertical plane with a second crystal orientation.

By providing the field effect transistor with a channel region having a crystalline orientation in which the hole mobility and the electron mobility are substantially the same, the embodiments of the present invention can be utilized to implement both the PMOS FET and the NMOS FET.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a field effect transistor having a carrier channel of a crystalline orientation where the hole mobility and the electron mobility are substantially the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

In the following discussion, crystalline silicon is used as an example, and the crystalline planes of the crystalline silicon are denoted by the commonly used Miller indices.

Figure 1:
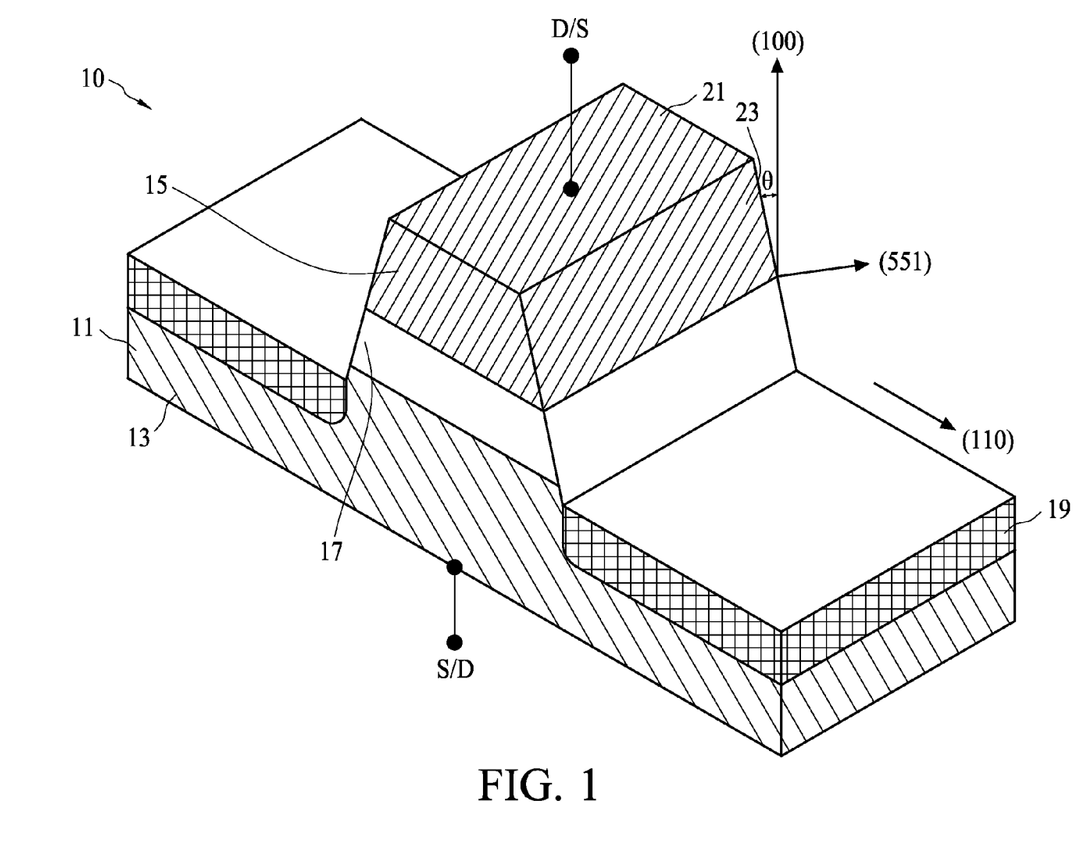
FIG. 1 to FIG. 3 illustrate a schematic view of a field effect transistor 10 according to one embodiment of the present invention.
Figure 2:
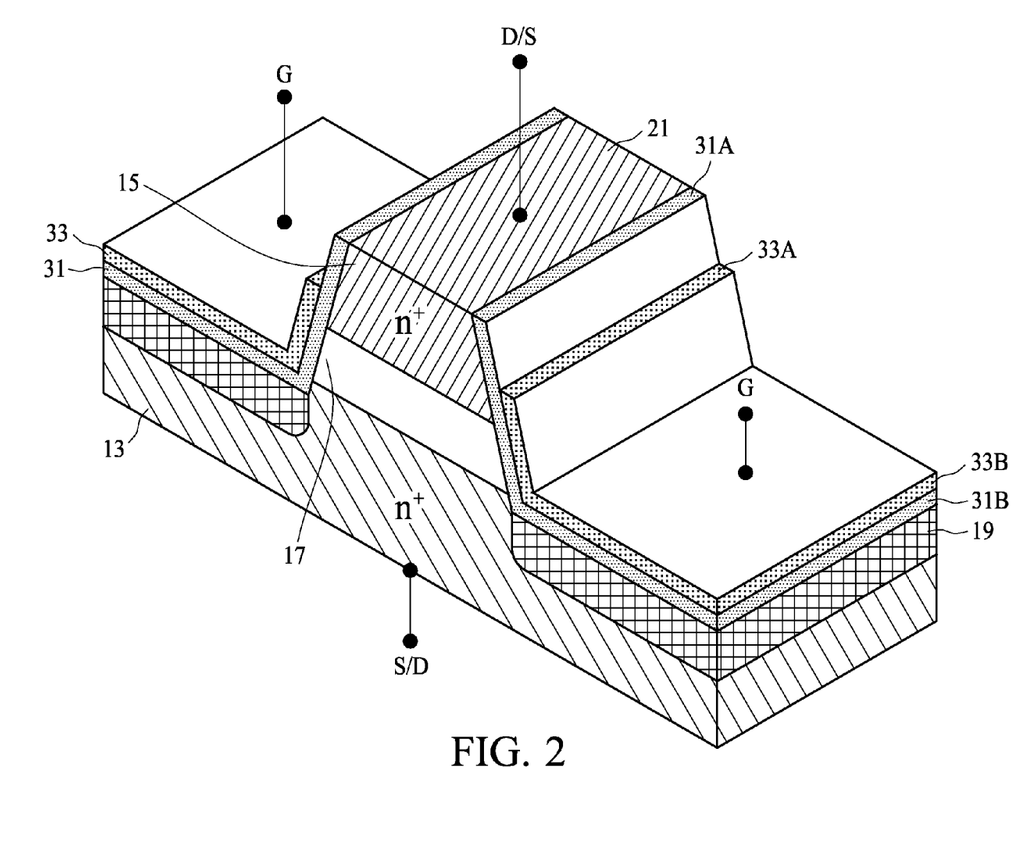
Figure 3:
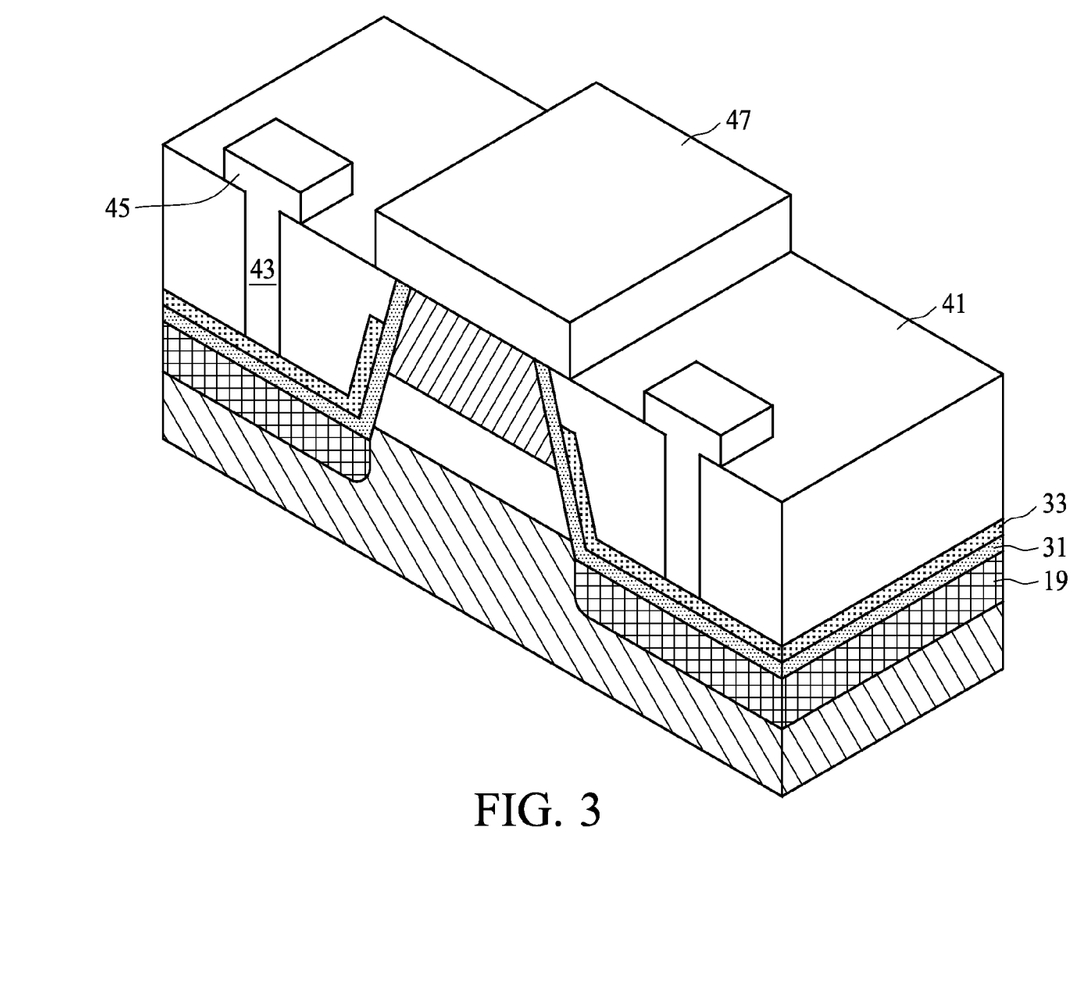

FIG. 1 to FIG. 3 illustrate a schematic view of a field effect transistor 10 according to one embodiment of the present invention. The field effect transistor 10 comprises a semiconductor substrate 11 having a protrusion 21 with at least one inclined surface 23, wherein the semiconductor substrate 11 has an insulation ion implant 19 configured to reduce the gate to substrate capacitances. In one embodiment of the present invention, the insulation ion implant 19 is formed by an ion implanting technique; for example, oxygen ion implantation. The semiconductor substrate 11 comprises a first doped (source/drain) region 13, a second doped (drain/source) region 15, and a channel region 17, wherein the first doped (source/drain) region 13 is disposed at the bottom of the semiconductor substrate 11 and the second doped (drain/source) region 15 is disposed at the top of the protrusion 21.

Referring to FIG. 1, since the protrusion 21 of the transistor 10 has a tapered trapezoid profile, it is easier to increase the carrier concentration (dopant concentration) by the implanting technique as compared to the conventional planar channel transistor. In one embodiment of the present invention, to form the trapezoid profile of the protrusion 21, a hard mask is formed on the top of the protrusion 21, and an reactive ionic etching process is performed with gradually reduced etching rate to form the protrusion 21 with the tapered trapezoid profile.

In one embodiment of the present invention, the at least one inclined surface 23 has a first crystal orientation in the channel region 17, the inclined surface 23 has an included angle (θ) to a vertical plane with a second crystal orientation, and the semiconductor substrate 11 has a third crystal orientation, e.g., the first crystal orientation is (551), the second crystal orientation is (100), and the third crystal orientation is (110). In one embodiment of the present invention, the included angle ranges from 9 to 10 degrees, 7 to 9 degrees, or 5 to 7 degrees.

Referring to FIG. 2, in one embodiment of the present invention, the field effect transistor 10 further comprises a gate insulator 31 disposed at least on a portion of the inclined surface 23, and a gate conductor 33 disposed on the gate insulator 31. In one embodiment of the present invention, the gate insulator 31 comprises an inclined portion 31A on the inclined surface 23 and a horizontal portion 31B connected to the inclined portion 31A, wherein the gate conductor 33 comprises an inclined portion 33A on the inclined surface 23 and a horizontal portion 33B connects to the inclined portion 33A.

Referring to FIG. 3, in one embodiment of the present invention, a dielectric layer 41 covers the gate conductor 33, a gate pad 45 is disposed on the surface of the dielectric layer 41, and a via 43 is disposed in the dielectric layer 41 and connects the gate pad 45 to the horizontal portion 33B of the gate conductor 33. In addition, in one embodiment of the present invention, a source/drain contact 41 is disposed on the surface of the dielectric layer 41 and connected to the second doped region 15, i.e., the top of the protrusion 21.

Figure 4:
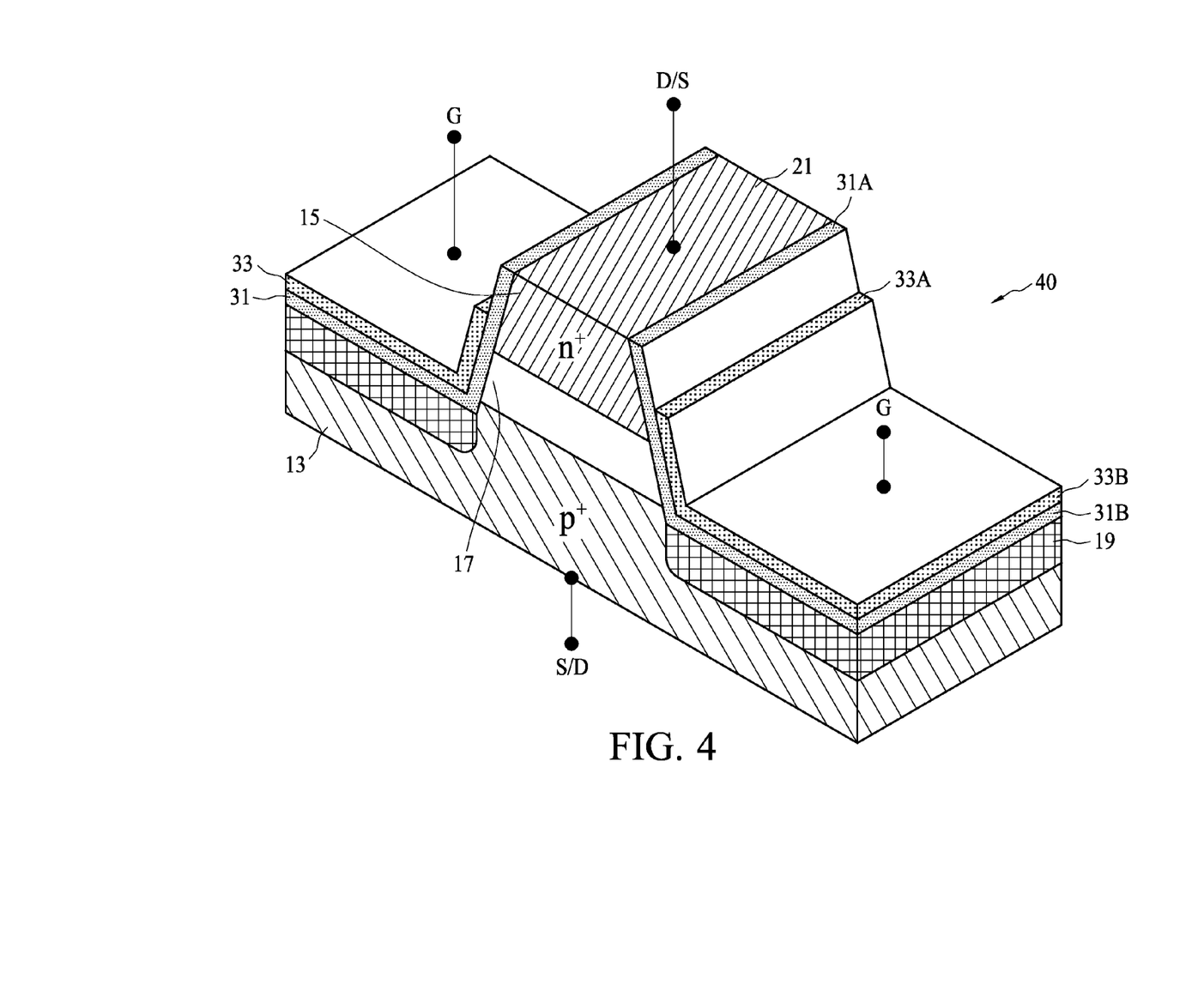
FIG. 4 illustrates a schematic view of a tunnel field effect transistor according to another embodiment of the present invention.

In one embodiment of the present invention, the first doped region 13 and second doped region 15 have the same conductivity type, e.g., both n-typed as shown in FIG. 2 or both p-typed (not shown in the drawings), to form a vertical field effect transistor. In another embodiment of the present invention, the first doped region 13 and second doped region 15 have different conductivity types as shown in FIG. 4, to form a vertical channel tunnel field effect transistor 40. In the vertical channel tunnel field effect transistor 40, the first doped (source/drain) region 13 can be n-typed, while the second doped (drain/source) region 15 is p-typed, and vice versa.

Figure 5:
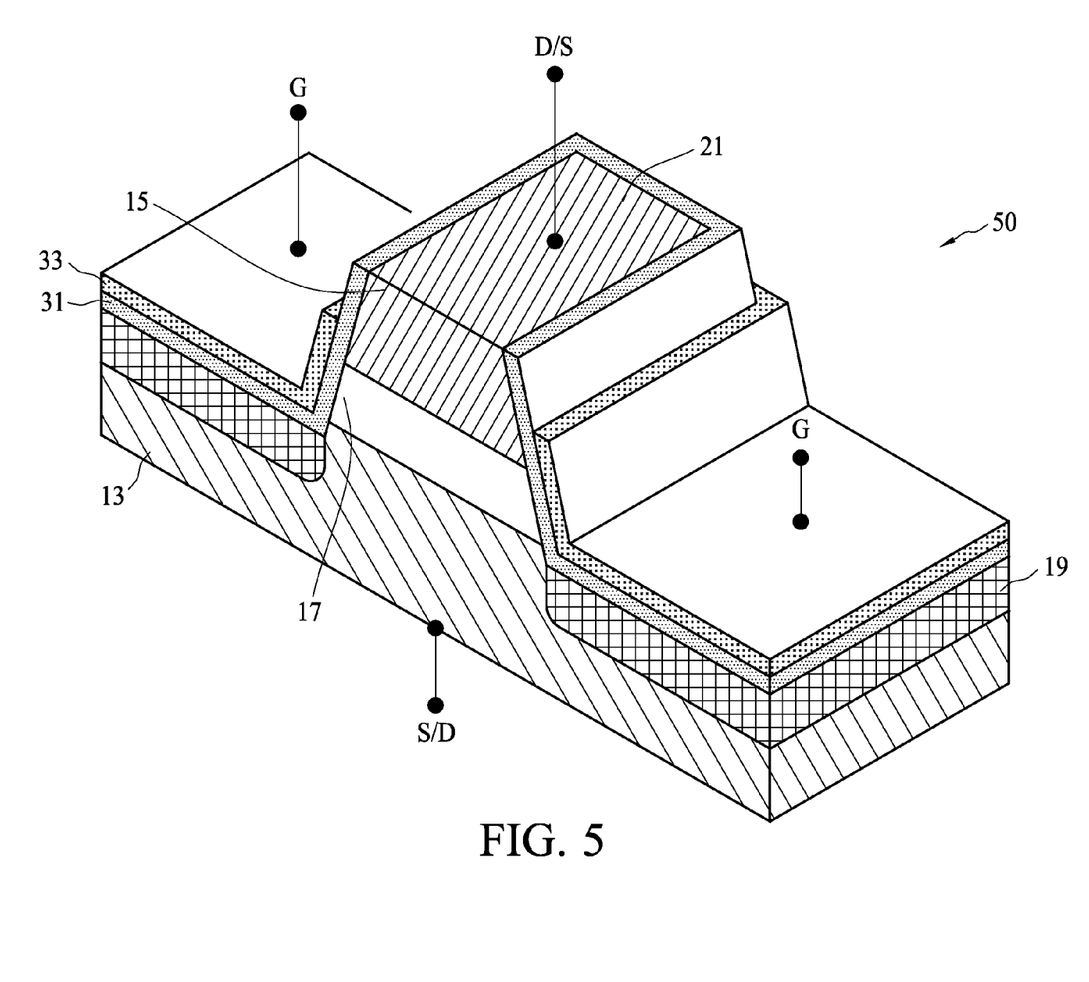
FIG. 5 illustrates a schematic view of a field effect transistor according to another embodiment of the present invention.

FIG. 5 illustrates a schematic view of a field effect transistor 50 according to another embodiment of the present invention. Compared to the field effect transistor 10 as shown in FIG. 2, the gate conductor 33 of the field effect transistor 50 as shown in FIG. 5 traverses the protrusion 21 horizontally to form a tri-gate structure.

Figure 6:
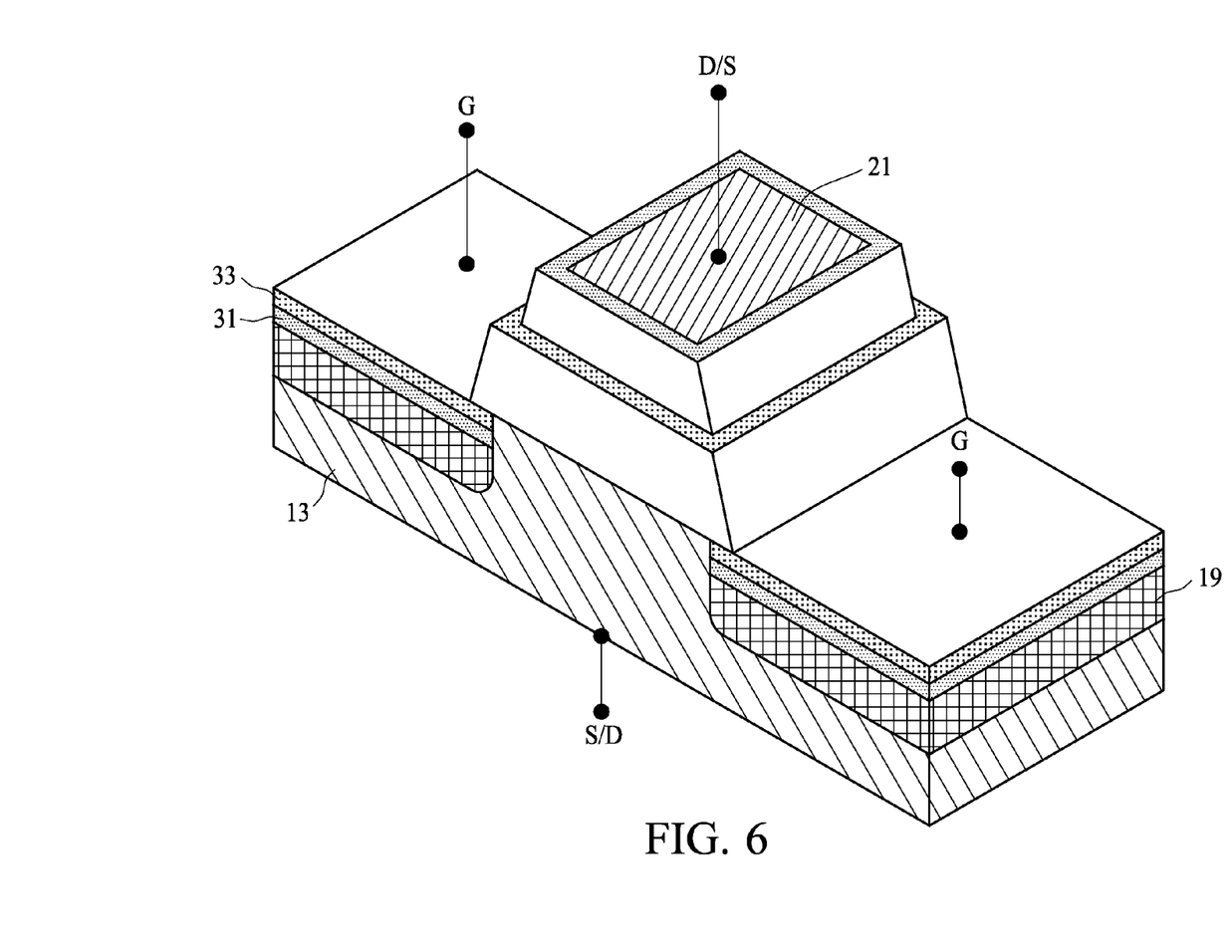
FIG. 6 illustrates a schematic view of a field effect transistor according to another embodiment of the present invention.

FIG. 6 illustrates a field effect transistor 60 according to another embodiment of the present invention. Compared to the field effect transistor 10 as shown in FIG. 2, the gate conductor 33 of the field effect transistor 60 as shown in FIG. 6 surrounds the protrusion 21 horizontally to form a gate-all-around structure.

Figure 7:
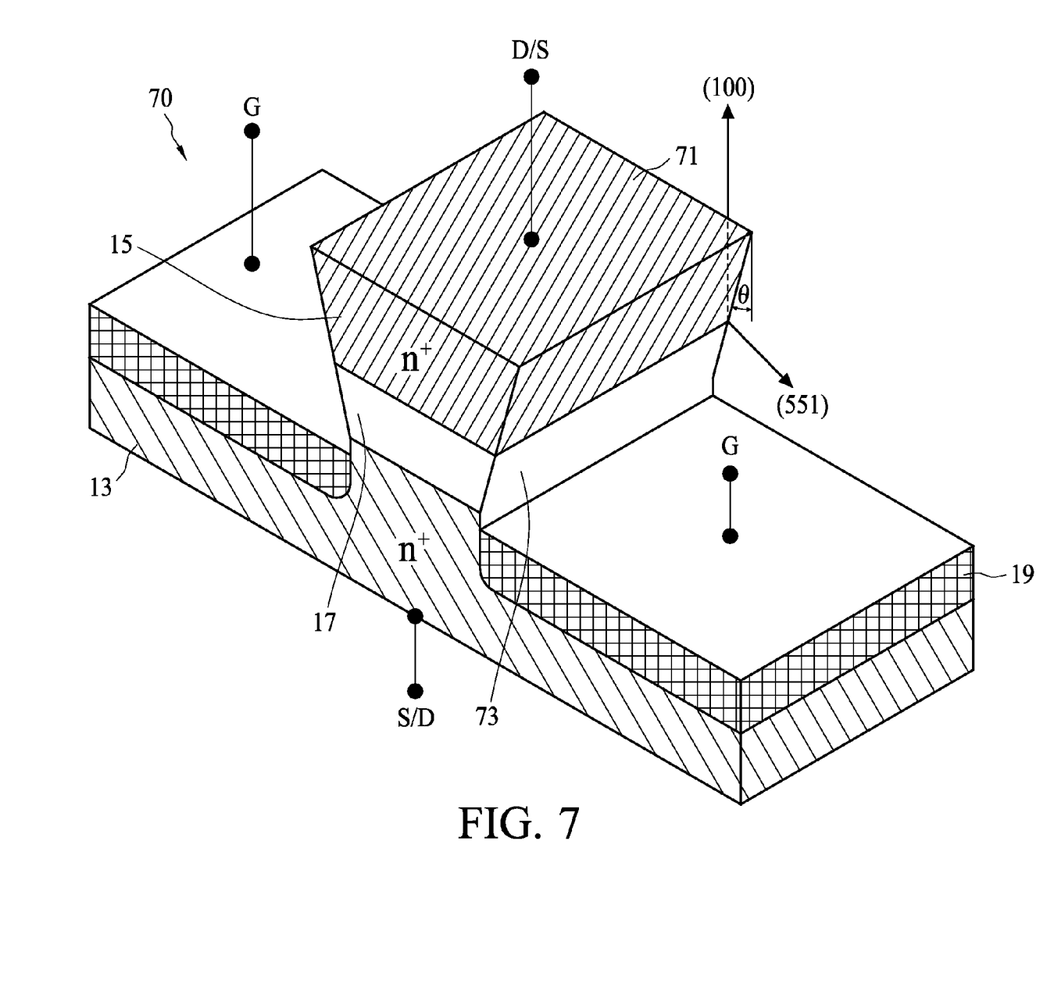
FIG. 7 and FIG. 8 illustrate a field effect transistor according to another embodiment of the present invention.
Figure 8:
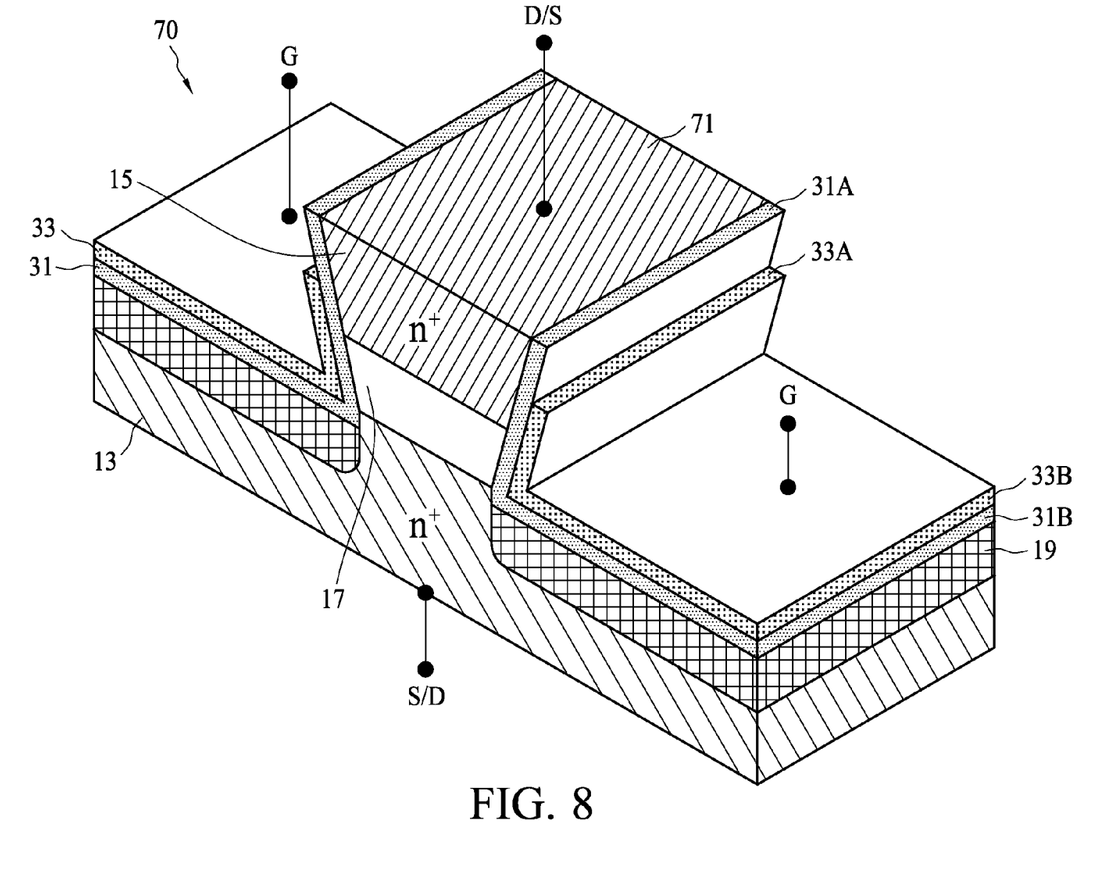

FIG. 7 and FIG. 8 illustrate a field effect transistor 70 according to another embodiment of the present invention. Compared to the field effect transistor 10 having a protrusion 21 with a trapezoid profile as shown in FIG. 2, the field effect transistor 70 comprises a protrusion 71 with an inverted trapezoid profile and at least one inclined surface 73. In one embodiment of the present invention, the at least one inclined surface 73 has a first crystal orientation in the channel region 17, the inclined surface 73 has an included angle (θ) to a vertical plane with a second crystal orientation, and the semiconductor substrate 11 has a third crystal orientation, e.g., the first crystal orientation is (551), the second crystal orientation is (100), and the third crystal orientation is (110). In one embodiment of the present invention, the included angle ranges from 9 to 10 degrees, 7 to 9 degrees, or 5 to 7 degrees.

In one embodiment of the present invention, to form the inverted trapezoid profile of the protrusion 71, a recessing process is performed to form hole with a tapered profile in an insulation layer, and an epitaxially growing process is performed to form a semiconductor material in the hole so as to form the fin structure 151 with the inverted trapezoid profile. A recess technique may include a buffered HF wet etch, $NH_3/NF_3$ and $SF_6/H_2O$ down-flow dry etch, or any suitable etch technique.

Figure 9:
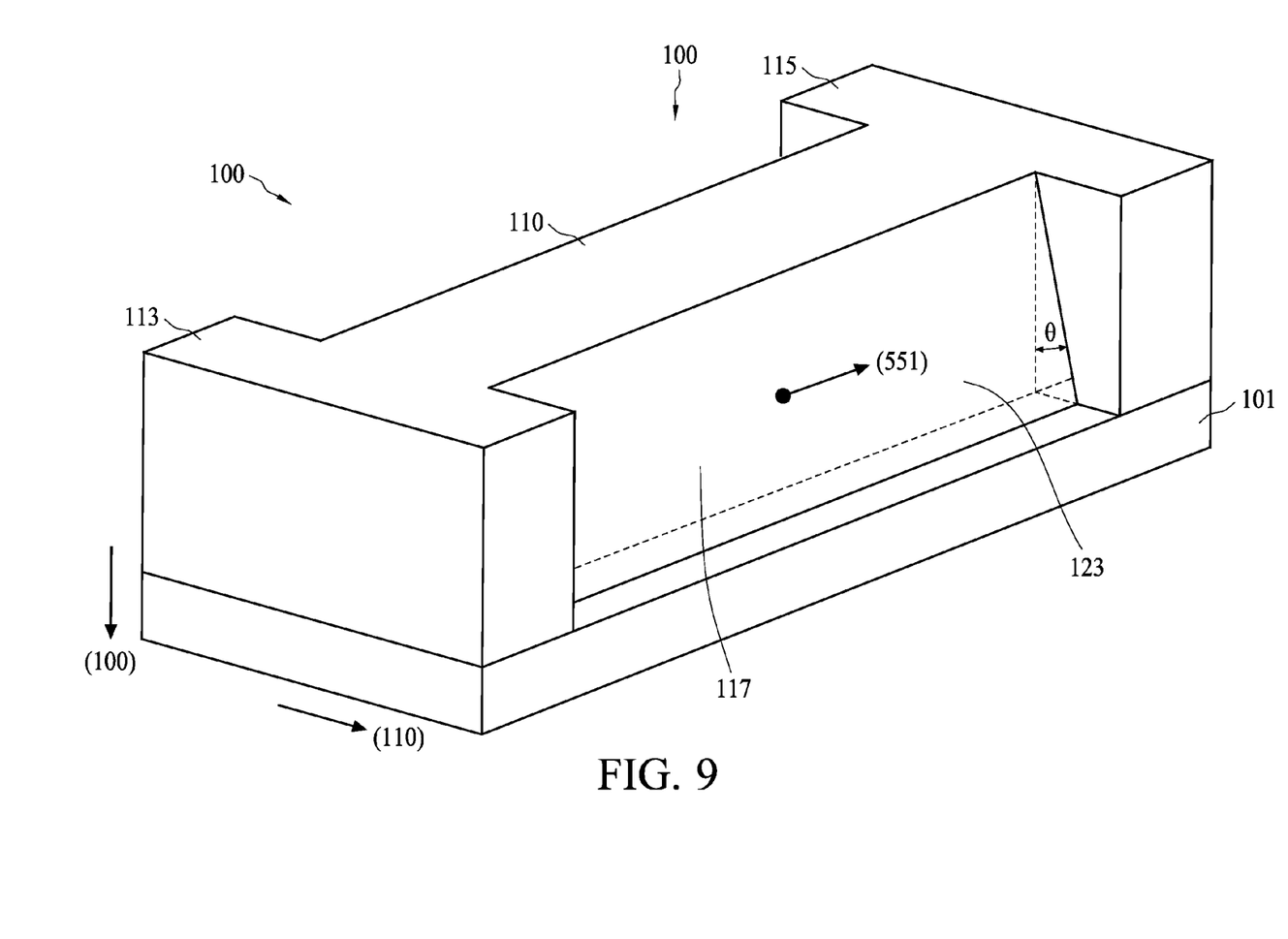
FIG. 9 and FIG. 10 illustrate a schematic view of a field effect transistor according to another embodiment of the present invention.
Figure 10:
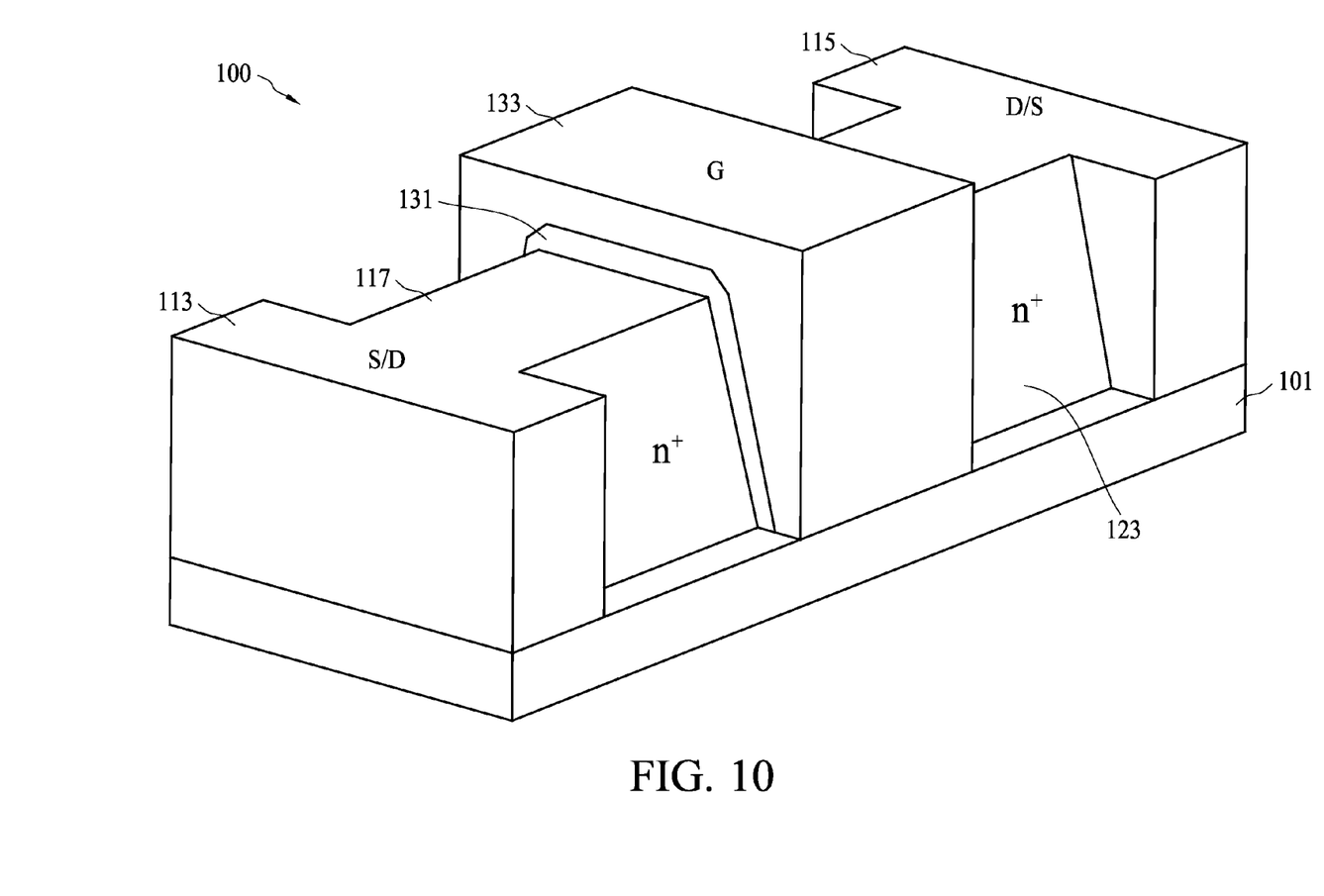

FIG. 9 and FIG. 10 illustrate a schematic view of a field effect transistor 100 according to another embodiment of the present invention. The field effect transistor 100 comprises a base 101, a fin structure 110 comprising a semiconductor material on the base 101, a gate insulator 131 disposed at least on a portion of the fin structure 110, and a gate conductor 133 disposed on the gate insulator 131, wherein the fin structure 110 comprises a first doped (source/drain) region 113, a second doped (drain/source) region 115 and a channel region 117. In one embodiment of the present invention, the gate conductor 133 traverses the fin structure 110 at the channel region 117.

In one embodiment of the present invention, the base 101 can be a p-type semiconductor substrate. In another embodiment of the present invention, the base 101 can be an insulator substrate formed by an oxygen implantation followed by a thermal oxidation.

Referring to FIG. 9, since the fin structure 110 of the transistor 100 has a tapered trapezoid profile, it is easier to increase the carrier concentration (dopant concentration) by the implanting technique as compared to the conventional planar channel transistor. In one embodiment of the present invention, to form the trapezoid profile of the fin structure 110, a hard mask is formed on the top of the fin structure 110, and an reactive ionic etching process is performed with gradually reduced etching rate to form the fin structure 110 with the tapered trapezoid profile.

In one embodiment of the present invention, the fin structure 110 has at least one inclined surface 123 with a first crystal orientation in the channel region 117, and the inclined surface 123 has an included angle (θ) to a vertical plane with a second crystal orientation. For example, the first crystal orientation is (551), the second crystal orientation is (100), and the third crystal orientation is (110). In one embodiment of the present invention, the included angle ranges from 9 to 10 degrees, 7 to 9 degrees, or 5 to 7 degrees.

Figure 11:
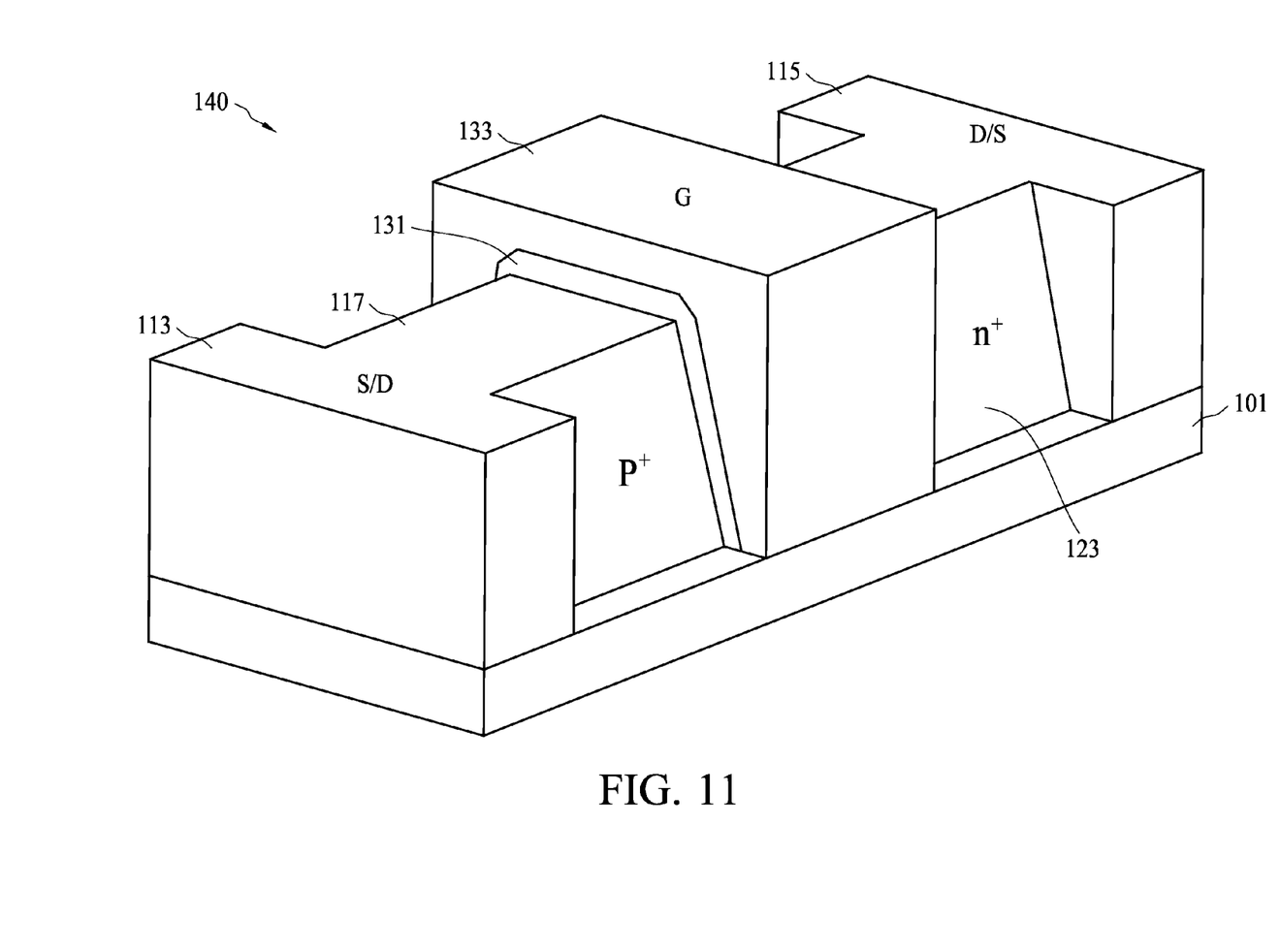
FIG. 11 illustrates a schematic view of a tunnel field effect transistor according to another embodiment of the present invention.

In one embodiment of the present invention, the first doped (source/drain) region 113 and second doped (drain/source) region 115 have the same conductivity type, e.g., both n-typed as shown in FIG. 10 or both p-typed (not shown in the drawings), to form a horizontal field effect transistor. In another embodiment of the present invention, the first doped (source/drain) region 113 and second doped (drain/source) region 115 have different conductivity types as shown in FIG. 11, to form a horizontal channel tunnel field effect transistor 140. In the horizontal channel tunnel field effect transistor 140, the first doped (source/drain region) 113 can be n-typed, while the second doped (drain/source) region 115 is p-type, and vice versa.

Figure 12:
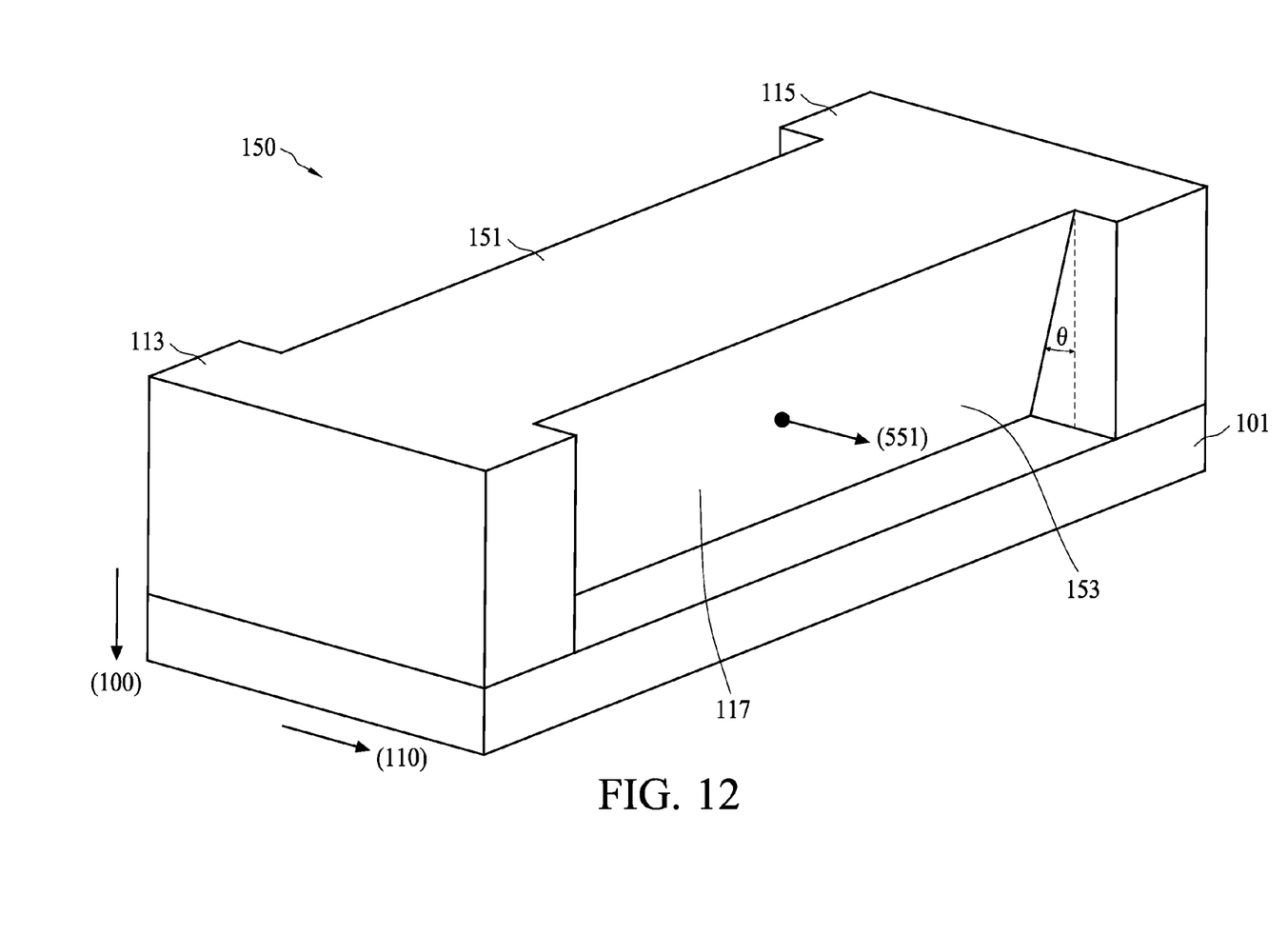
FIG. 12 and FIG. 13 illustrate a field effect transistor according to another embodiment of the present invention.
Figure 13:
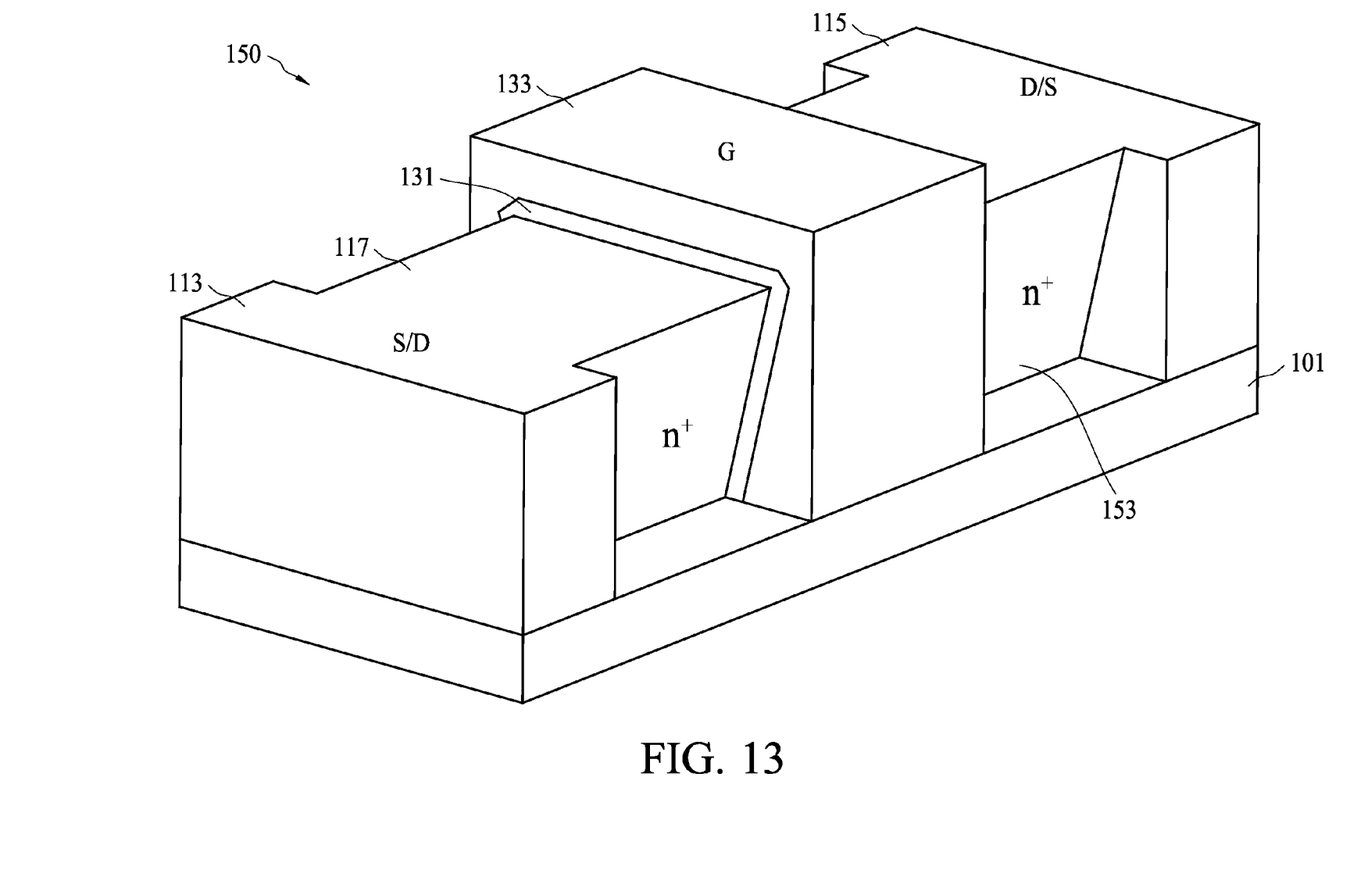

FIG. 12 and FIG. 13 illustrate a field effect transistor 150 according to another embodiment of the present invention. Compared to the field effect transistor 100 having the fin structure 110 with a trapezoid profile as shown in FIG. 9, the field effect transistor 150 comprises a fin structure 151 with an inverted trapezoid profile and at least one inclined surface 153. In one embodiment of the present invention, the at least one inclined surface 153 has a first crystal orientation in the channel region 117, the inclined surface 153 has an included angle (θ) to a vertical plane with a second crystal orientation, and the semiconductor substrate 111 has a third crystal orientation, e.g., the first crystal orientation is (551), the second crystal orientation is (100), and the third crystal orientation is (110). In one embodiment of the present invention, the included angle ranges from 9 to 10 degrees, 7 to 9 degrees, or 5 to 7 degrees.

In one embodiment of the present invention, to form the inverted trapezoid profile of the fin structure 151, a recessing process is performed to form hole with a tapered profile in an insulation layer, and an epitaxially growing process is performed to form a semiconductor material in the hole so as to form the fin structure 151 with the inverted trapezoid profile. A recess technique may include a buffered HF wet etch, $NH_3/NF_3$ and $SF_6/H_2O$ down-flow dry etch, or any suitable etch technique.

Figure 14:
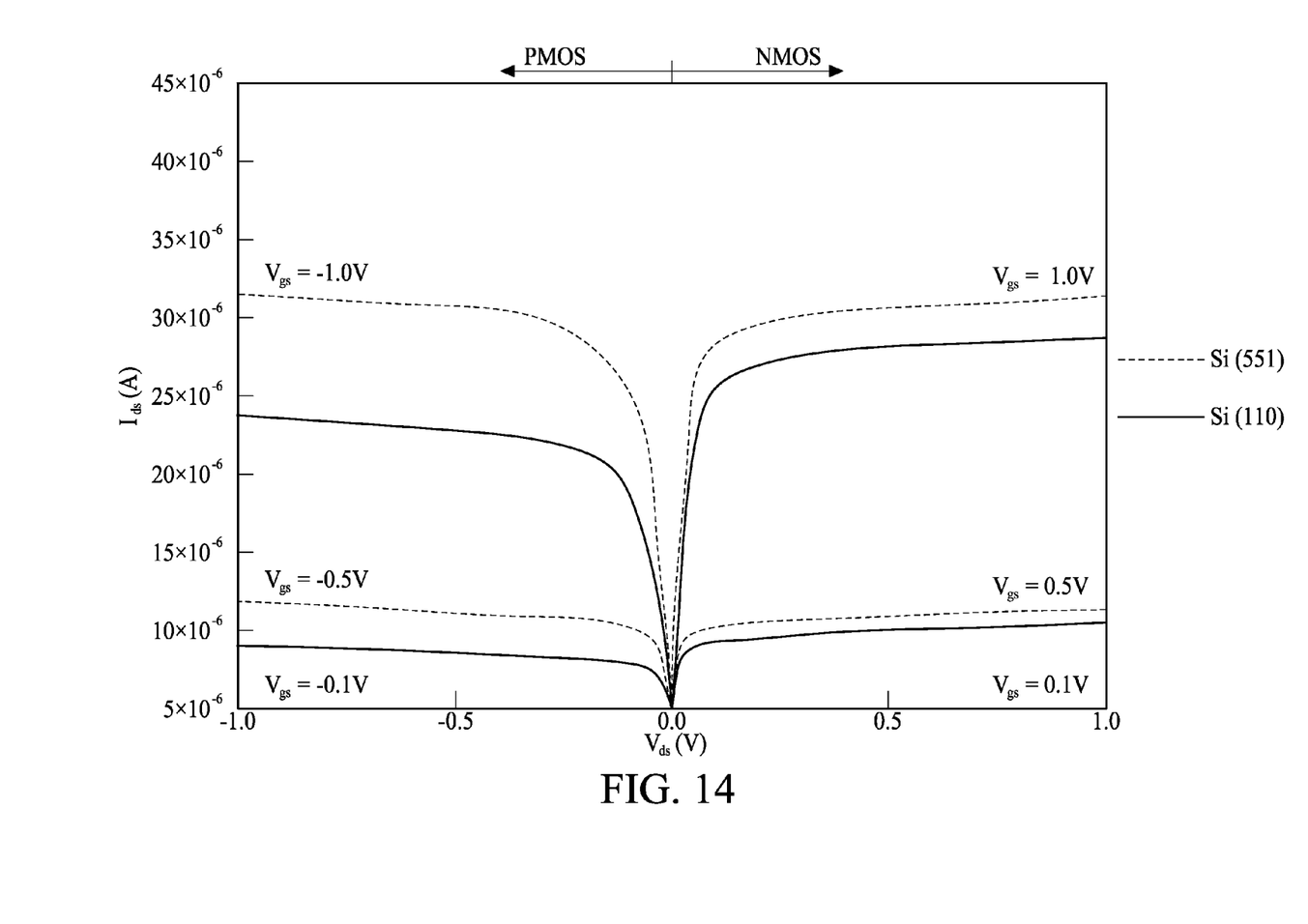
FIG. 14 is a measurement of the drain current (Id) of the PMOS FET and the NMOS FET with a carrier channel implemented on the silicon (551) and silicon (110) planes, respectively.

FIG. 14 is a measurement of the drain current (Id) of the PMOS FET and the NMOS FET with a carrier channel implemented on the silicon (551) and silicon (110) planes, respectively. For the PMOS FET and the NMOS FET with a carrier channels implemented on the silicon (110) planes, the drain current of the PMOS FET is different from that of the NMOS FET because the hole mobility (470 $cm^2/Vs$) is lower than the electron mobility (1417 $cm^2/Vs$) on the silicon (110) planes. In contrast, the drain current of the PMOS FET is the same as that of the NMOS FET because the hole mobility (2000 $cm^2/Vs$) is the same as the electron mobility (2000 $cm^2/Vs$) on the silicon (551) planes. As a result, the embodiments of the present invention can be utilized to implement both the PMOS FET and the NMOS FET because the field effect transistor with the channel region has a crystalline orientation where the hole mobility and the electron mobility are substantially the same.

Because the hole mobility (470 $cm^2/Vs$) of the PMOS FET is lower than the electron mobility (1417 $cm^2/Vs$) of the NMOS FET on the silicon (110) planes, conventional CMOS circuits have been laid out on silicon substrates in a random topological manner which occupies a considerable amount of space on the substrate. Due to this random layout, the architecture of the conventional CMOS circuits requires an increased number of interconnecting leads between the various individual circuit elements as well as a high number of power leads, which run in an inefficient manner throughout the circuits. As a consequence, the prior art conventional CMOS suffers from slower speed of operation and high manufacturing cost. Therefore, it would be desirable to provide balanced CMOS logic circuits which are arranged on a semiconductor substrate with topological regularity so as to require a lesser amount of integrated surface area. By utilizing an integrated circuit with reduced surface area, the implementation of various logic circuits on the semiconductor substrate will minimize the operating load routing requirements, which will improve the speed and efficiency of the circuit.

The embodiments of the present invention can be utilized to implement both the PMOS FET and the NMOS FET for the balanced CMOS logic circuits because the field effect transistor with the channel region has a crystalline orientation where the hole mobility and the electron mobility are substantially the same. Consequently, embodiments of the present invention can be used to implement the balanced CMOS logic circuits, which are arranged on a semiconductor substrate with topological regularity so as to require a lesser amount of integrated surface area. In addition, by utilizing the embodiments of the present invention to implement the integrated circuit so as to reduce surface area, the implementation of various logic circuits on the semiconductor substrate will minimize the operating load routing requirements, which will improve the speed and efficiency of the circuit.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A field effect transistor, comprising:
   a semiconductor substrate having a protrusion with a sloped incline surface, the semiconductor substrate comprising doped regions sandwiching a channel region;
   a gate insulator disposed at least on a portion of the sloped incline surface;
   a gate conductor disposed on the gate insulator;
   wherein the arrangement of the semiconductor substrate, the gate insulator, and the gate conductor enables electron flow in a direction from a base of the semiconductor substrate to a distal end of the protrusion, wherein the distal end of the protrusion is a region furthest away from the base of the semiconductor substrate; and
   wherein the sloped incline surface has a first crystal orientation in the channel region, and the sloped incline surface has an included angle to a vertical plane with a second crystal orientation.

2. The field effect transistor of claim 1, wherein the first crystal orientation is (551) and the second crystal orientation is (100).

3. The field effect transistor of claim 1, wherein the semiconductor substrate has a third crystal orientation of (110).

4. The field effect transistor of claim 1, wherein the included angle ranges from 9 to 10 degrees.

5. The field effect transistor of claim 1, wherein the included angle ranges from 7 to 9 degrees.

6. The field effect transistor of claim 1, wherein the included angle ranges from 5 to 7 degrees.

7. The field effect transistor of claim 1, wherein the gate conductor traverses the protrusion horizontally.

8. The field effect transistor of claim 1, wherein the gate conductor surrounds the protrusion horizontally.

9. The field effect transistor of claim 1, wherein the protrusion has a trapezoid profile.

10. The field effect transistor of claim 1, wherein the protrusion has an inverted trapezoid profile.

11. The field effect transistor of claim 1, wherein the doped regions are disposed at a top of the protrusion and a bottom of the semiconductor substrate.

12. The field effect transistor of claim 1, wherein the gate insulator comprises an inclined portion on the sloped incline surface and a horizontal portion connected to the inclined portion.

13. The field effect transistor of claim 1, wherein the gate conductor comprises an inclined portion on the sloped incline surface and a horizontal portion connected to the inclined portion.

14. The field effect transistor of claim 1, wherein the doped regions have different conductivity types.

* * * * *